(12) United States Patent
Primack et al.

(10) Patent No.: US 6,931,082 B2
(45) Date of Patent: Aug. 16, 2005

(54) DIGITAL PHASE LOCKED LOOP

(75) Inventors: Harel Primack, Rishon Le-Zion (IL); Netzer Moriya, Ramat Hasharon (IL)

(73) Assignee: Netmor Ltd. (IL)

( * ) Notice: Subject to any disclaimer, the term of this patent is extended or adjusted under 35 U.S.C. 154(b) by 829 days.

(21) Appl. No.: 09/829,838

(22) Filed: Apr. 10, 2001

(65) Prior Publication Data

US 2002/0191714 A1 Dec. 19, 2002

(51) Int. Cl.[7] .............................. H03D 3/24; H03D 3/00
(52) U.S. Cl. ........................................ 375/327; 329/308
(58) Field of Search ............................... 375/316, 326, 375/327, 371, 373, 376, 268, 320; 329/307, 308, 347; 708/811, 440, 270, 271, 272, 276

(56) References Cited

U.S. PATENT DOCUMENTS

| | | | |
|---|---|---|---|
| 4,285,044 A | 8/1981 | Thomas et al. ............. 364/721 |
| 4,761,751 A | 8/1988 | Canniff ....................... 364/721 |
| 4,888,719 A | 12/1989 | Yassa .......................... 364/721 |
| 4,905,177 A | 2/1990 | Weaver, Jr. et al. ......... 364/721 |
| 5,113,361 A | 5/1992 | Damerow et al. ........... 364/721 |
| 5,159,435 A | * 10/1992 | Holmbo et al. ............. 348/718 |
| 5,631,586 A | 5/1997 | Sogo ........................... 327/106 |
| 6,154,483 A | * 11/2000 | Davidovici et al. ......... 375/130 |
| 6,735,263 B1 | * 5/2004 | Moriya et al. ............... 375/326 |

OTHER PUBLICATIONS

Jacob Klapper and John T. Frankle, *Phase–Locked and Frequency Feedback Systems*, Academic Press, New York, 1972; Ch. 8.

* cited by examiner

*Primary Examiner*—Tesfaldet Bocure
(74) *Attorney, Agent, or Firm*—Fitch, Even, Tabin & Flannery (57) ABSTRACT

A technique that enables the sine and cosine branches within a PLL module to be obtained relatively easily and efficiently is described. According to the technique, the computation operations requiring a computation load, such as calculation of sine and cosine functions, are performed mostly once per a digital sampled signal, while relatively simple operations, such as multiplication and accumulations, are performed for every frame.

30 Claims, 3 Drawing Sheets

DIGITAL PHASE LOCKED LOOP

FIELD OF THE INVENTION

This invention relates to a digital phased locked loop (PLL) technique and, more particularly, to generation of digital sine and cosine branches of a PLL and amplitude demodulation.

BACKGROUND OF THE INVENTION

The concept of implementing a phased-locked loop (PLL) technique in a digital signal processor (DSP) for demodulating a received FDMA signal is fairly known in the art (see, for example, Jacob Klapper and John T. Frankle, Phase-Locked and Frequency Feedback Systems, Academic Press, New York, 1972; Ch. 8). However, these techniques were employed usually for carrier recovery rather than for processing the received message and envelope demodulation.

A method utilizing a PLL technique for coherent detection and demodulation of a FDMA signal, that is a superposition of amplitude modulated carriers is described in U.S. application Ser. No. 09/575,517. An array of special digital phase-locked loops (PLLs) is implemented in a DSP for processing the received signal after it is digitized, and for extracting the envelopes corresponding to each carrier. The quality of the envelope estimate depends on the ability of the DSP to overcome all sources of inaccuracies such as coupling between the individual carriers and harmonic distortions while preserving a spectral bandwidth covering the spectrum of the modulating signal. In addition, the demodulation process should be performed in real time and introduce only a short processing delay.

It should be noted that one of the most time consuming operations when using a PLL technique for envelope extraction is associated with generation of sine and cosine waveforms. One common approach for the synthesis of the trigonometric functions is to build a lookup table where the exact values of the sine and/or cosine functions are stored up to a desired accuracy. This method was further enhanced by interpolation between table entries (see, for example, U.S. Pat. No 4,905,177).

Alternatively, sine and cosine waveforms may be synthesized by using a real-time solution of a difference equation (see, for example, U.S. Pat. No 4,888,719). Several enhancements to these methods were disclosed (see, for example, U.S. Pat. Nos. 5,113,361, 4,761,751, 5,631,586). Despite the apparent superiority of the difference equation method, due to the finite precision of the computer, implementation of difference equation solution in DSP may produce an accumulating error. The error may lead to both phase and amplitude drift (see, for example, U.S. Pat. No 4,285,044) affecting the accuracy of the envelope calculation, and thus a control mechanism is required.

Synthesis of trigonometric functions by employing the prior art technique is a complicated task, requiring relatively high computational load and large storage space for storing the computed data, since such synthesis is performed for a digital sampled signal divided into frames consequently frame by frame for each sample of the frame. This may adversely effect the PLL performance and interfere with real-time and memory requirements.

There is, accordingly, a need in the art to provide an improved technique that substantially reduces the drawbacks of the hitherto known techniques for generation of the trigonometric functions within a PLL in general, and, in particular, when the PLL is utilized for amplitude demodulation and envelope extraction in particular for real-time applications.

SUMMARY OF THE INVENTION

The general purpose of the present invention, which will be described subsequently in greater detail, is to overcome the above disadvantages. The foregoing purpose is accomplished by providing a new method that enables the sine and cosine branches within a PLL module to be obtained relatively easily and efficiently. According to the method, the computation operations requiring a heavy computation load, such as calculation of sine and cosine functions, are performed mostly once per a digital sampled signal, whilst relatively simple operations, such as multiplication and accumulations, are performed repetitively for every frame of the aforementioned sampled digital signal.

Accordingly, the purpose is accomplished by providing a method for generation of sine I and cosine Q branches of a digital phase locked loop comprising the step of processing a digital sampled signal divided into plurality of frames having substantially equal number of samples comprising the steps of:

representing an angular frequency of the signal for each frame of said plurality of frames as a sum of a nominal angular frequency component being a common value to said plurality of frames, and an angular frequency component depending on the frame number and having an absolute value substantially smaller than a reversed value of a frame size multiplied by a sampling time increment;

calculating for a frame from said plurality of frames data indicative of values of analytical functions including trigonometric functions depending at least on said nominal frequency;

storing the data obtained in the previous step;

generating said sine I and cosine Q branches by utilizing the data of the analytical functions stored in previous step, values of the angular frequency component depending on the frame number and the sampling time increment for substantially all frames of said plurality of the frames.

The foregoing purpose is also accomplished by providing a digital phase locked loop (PLL) module configured to receive a digital sampled signal divided into plurality of frames having substantially equal number of samples, frequency of the signal for each frame of said plurality of frames is represented as a sum of a nominal frequency component, being a common value to said plurality of frames, and a frequency component depending on the frame number and having an absolute value substantially smaller than a reversed value of a frame size multiplied by the sampling time increment, the PLL module comprising:

at least one Table Memory Unit configured for storing data indicative of values of analytical functions including trigonometric functions depending at least on said nominal frequency;

at least one multiply-and-accumulate unit provided with the data stored in said at least one Table Memory Unit and configured to sum the results of multiplication of said digital sampled signal and said values of analytical functions frame by frame;

at least one Branch Computation Unit receiving the output provided by said at least one multiply-and-accumulate unit and generating sine I and cosine Q branches;

at least one phase detector for generating an error signal for locking the PLL and providing said error signal to said at least one Branch Computation Unit.

There has thus been outlined, rather broadly, the more important features of the invention in order that the detailed description thereof that follows hereinafter may be better understood, and in order that the present contribution to the art may be beater appreciated. Additional details and advantages of the invention will be set forth in the detailed description, and in part will be obvious from the description, or may be learned by practice of the invention.

It can be appreciated by a man of the art that the method of generation of sine and cosine branches as well as the PLL module of the present invention may have numerous applications. The list of application includes Cellular Phones and Wireless communication technology, MRI and NMR in medical systems, Digital Receivers in RF communication components, Radar systems for military, civilian, airport etc. needs, Sonar Systems, Navigation technology and apparatuses, Car safety systems (e.g. collision hazard), Digital modulation and Demodulation in signal processing, Antenna positioning in RF-based systems, Motor control in various industrial applications, etc.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Attention is first directed to a background describing a generation of the I and Q branches of a digital sampled signal $S(i\Delta t)$ (wherein $\Delta t$ is the sampling time increment and $i=1,2,\ldots$) by a PLL according to a preferred embodiment of the present invention. The signal $S(i\Delta t)$ may be divided into equal frames of N samples in each frame, such that $$S_n^k \equiv S((n+N(k-1))\Delta t) \quad (1)$$

wherein k is the frames index ($k=1, 2, \ldots$) and n is the sample index within the frame ($n=1, 2, \ldots$).

The sine and cosine branches of the PLL are described by the following equations:

$$I^k \equiv \sum_{n=1}^{N} S_n^k f_n \sin(\omega^k n\Delta t + \varphi^k) \quad (2)$$

and $$Q^k \equiv \sum_{n=1}^{N} S_n^k f_n \cos(\omega^k n\Delta t + \varphi^k) \quad (3)$$

where $I^k$ and $Q^k$ are the sine and cosine branches of the k-th frame, $f_n$ is a vector of N taps of a low-pass filter calculated off line and stored in a memory of the PLL module. For normalization, the sum of the filter taps, for example, equals 2. The inner parameters $\omega^k$, $\varphi^k$ are the k-th estimates of the angular frequency and phase, respectively.

It should be noted that in Eqs. (2) and (3) the low-pass filter is applied only once per frame, thereby only a single multiplication of the frame by the vector of the filter taps $f_n$ is employed. Such down-decimation is utilized in order to reduce the computational load. However, it should be appreciated that the invention is not bound to this representation of the I and Q branches and an ordinary multiplication of a frame by the filter for each sampled point producing a digital convolution of filter taps with the sampled data may also be employed.

It should also be appreciated that while for simplicity of description of the invention the length of the frame and the length of the filter were selected to be equal, the invention is not bound to such a case.

Notwithstanding the fact that employing the aforementioned down-decimation significantly reduces the computational load, the generation of the I and Q branches by using Eqs. (2) and (3) still has problems associated with (i) a heavy computational load when calculating the sine and cosine waveforms for each frame and (ii) a large memory volume, which is required for storage of these calculated values for each frame.

The description below illustrates how these computational load and memory requirements might be significantly reduced.

According to a preferred embodiment of the present invention, Eqs. (2) and (3) are rewritten in a complex notation to read as:

$$Z^k \equiv (Q^k + iI^k) = \sum_{n=1}^{N} S_n^k f_n e^{i(\omega^k n\Delta t + \varphi^k)} = e^{i\varphi^k} \sum_{n=1}^{N} S_n^k f_n e^{i\omega^k n\Delta t}. \quad (4)$$

The frequency $\omega^k$ is represented by a sum of two terms:

$$\omega^k = \omega_0 + \Delta\omega^k, \quad (5)$$

wherein $\omega_0$ is the nominal frequency component having a common value to all frames and $\Delta\omega^k$ is the frequency component depending on the frame number k.

After substitution of Eq. (5) into Eq. (4), there is a following equation for $Z^k$:

$$Z^k = e^{i\varphi^k} \sum_{n=1}^{N} S_n^k f_n e^{i(\omega_0 + \Delta\omega^k)n\Delta t} = e^{i\varphi^k} \sum_{n=1}^{N} S_n^k [f_n e^{i\omega_0 n\Delta t}] e^{i\Delta\omega^k n\Delta t}. \quad (6)$$

Eq. (6) is further simplified by applying the Taylor expansion for the exponential functions by using a value of $\Delta\omega^k n\Delta t$ as a small parameter, and leaving in the equation obtained only the terms that are not larger in order than linear functions of $\Delta\omega^k$, to with:

$$Z^k \approx e^{i\varphi^k}\sum_{n=1}^{N} S_n^k[f_n e^{i\omega_0 n\Delta t}](1+i\Delta\omega^k n\Delta t) = e^{i\varphi^k}\sum_{n=1}^{N} S_n^k[a_n + i\Delta\omega^k b_n] \quad (7)$$

wherein by definition:

$$a_n = f_n e^{i\omega_0 n\Delta t} \text{ and } b_n = a_n\Delta t, \text{ for } n=1, \ldots, N. \quad (8)$$

One has to bear in mind that the Taylor expansion could be performed only when the following condition is fulfilled:

$$\Delta\omega^k N\Delta t \ll 1, \quad (9)$$

i.e. in words, the above described technique is valid when the maximal deviation of the phase accumulated over a frame from its nominal value $\omega_0 N\Delta t$ is much smaller than 1. Condition (9) is fulfilled when the component $\Delta\omega^k$ has an absolute value substantially smaller than a reversed value of a frame size N multiplied by a sampling time increment $\Delta t$.

It may be readily appreciated that condition (9) is fulfilled, usually, in practice. For example, assuming that $\Delta\omega^k=1$ Hz, N=1000 and $\Delta t=10$ μsec, it turns that $\Delta\omega^k N\Delta t=0.01<1$.

It should be noted that $a_n$ and $b_n$ are complex vectors composed of real sine and cosine components $a_n^{(s)}$, $a_n^{(c)}$, $b_n^{(s)}$ and $b_n^{(c)}$, respectively, expressed by Eqs. (10a)–(10d), to wit:

$$a_n^{(s)} = f_n \sin(\omega_0 n\Delta t), \quad (10a)$$

$$a_n^{(c)} = f_n \cos(\omega_0 n\Delta t), \quad (10b)$$

$$b_n^{(s)} = n\Delta t \cdot a_n^{(s)}, \quad (10c)$$

$$b_n^{(c)} = n\Delta t \cdot a_n^{(c)} \quad (10d)$$

wherein n=1, . . . , N.

It should be further noted that the values $a_n$ and $b_n$ (n=1, . . . , N) and, accordingly, sine and cosine components, $a_n^{(s)}$, $a_n^{(c)}$, $b_n^{(s)}$ and $b_n^{(c)}$, do not depend on the frame index k. Therefore, these values can be calculated off line for any frame, stored in memory and used in on line calculations for all the frames. It may substantially reduce the computational load for calculation of I and Q branches, since mostly the "multiply and accumulate" operations should be performed on-line for every frame during the computation of the branches.

In the description above, sine and cosine waveform vector values were calculated off line by using all N samples of a frame. This calculation has in some cases intrinsic redundancy considering the repetitive nature of sine and cosine functions. Thus, in accordance with further improvement of the invention, utilization of the periodicity property of the sine and cosine functions, (e.g. sin(x)=sin(x+2πm)=|sin(x+πm)|, wherein m=1, 2 . . . ), may further reduce the memory volume required for storing the values of $a_n^{(s)}$, $a_n^{(c)}$, $b_n^{(s)}$ and $b_n^{(c)}$ calculated for a frame. Thus, for example, if there exists $n_0$ such that $\omega_0 n_0 \Delta t = 2\pi m$, where m is an integer, then only the samples having number 1, . . . , $n_0$ are needed to be calculated and stored, while the rest values are reproduced by using the periodicity.

Figure 1:
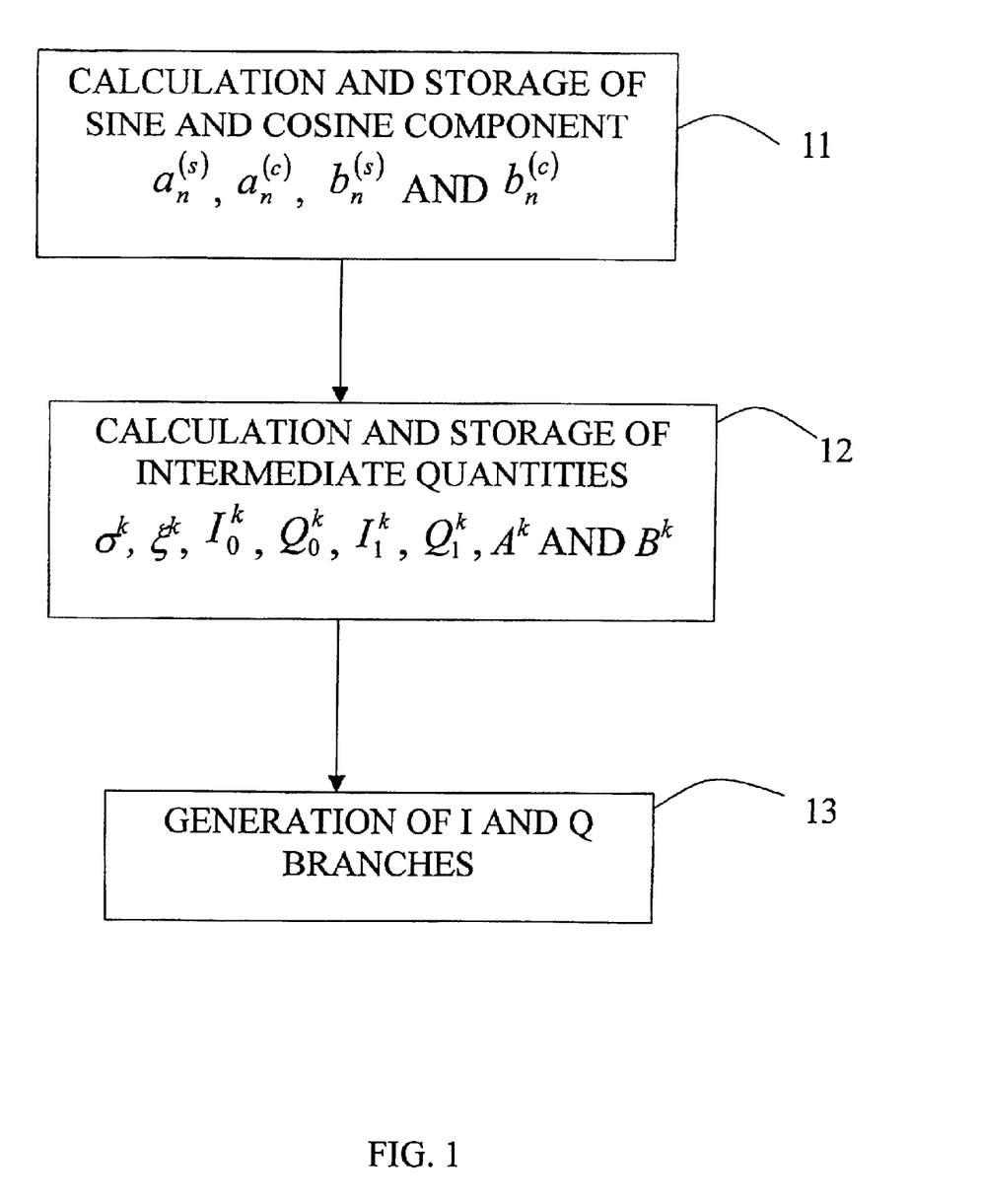
FIG. 1 is a flowchart illustrating an example of generation of sine and cosine branches (I- and Q-branches, respectively) of a digital sampled signal according to one preferred embodiment of the present invention.

Turning now to FIG. 1, there is provided an example of generation of the I and Q branches of the digital sampled signal $S_n^k = S((n+N(k-1))\Delta t)$ divided into equal frames of N samples in each frame by utilizing the described technique.

In this example, once the signal $S_n^k$ is fed into a PLL module employing the described technique, in a step 11, analytical functions, such as arrays of sine and cosine components $a_n^{(s)}$, $a_n^{(c)}$, $b_n^{(s)}$ and $b_n^{(c)}$ are calculated. The latter are calculated (preferably off line) only for one frame and stored. The calculation is performed according to Eqs. (10a)–(10d) for a frame k (e.g. for the first frame, i.e. k=1). These sine and cosine components $a_n^{(s)}$, $a_n^{(c)}$, $b_n^{(s)}$ and $b_n^{(c)}$ are utilized in following on line calculations performed for all other frames.

Having calculated the arrays of sine and cosine components $a_n^{(s)}$, $a_n^{(c)}$, $b_n^{(s)}$ and $b_n^{(c)}$ in the manner described above, it is now required to calculate the branches I and Q, represented in the complex form by Eq. (7).

There follows now a mathematical presentation for calculation, which will result in mathematical expressions representing the I and Q branches for the k-th frame. Thus, as shown, in a step 12 the intermediate quantities $\sigma^k$, $\xi^k$, $I_0^k$, $Q_0^k$, $I_1^k$, $Q_1^k$, $A^k$ and $B^k$ are calculated consequently frame by frame and stored for each k-th frame (k=1, 2, . . . ). The calculation is performed in accordance with Eqs. (11a)–(11h)):

$$\sigma^k = \sin(\varphi^k) \quad (11a)$$

$$\xi_p = \cos(\varphi^k) \quad (11b)$$

$$I_0^k = \sum_{n=1}^{N} S_n^k a_n^{(s)} \quad (11c)$$

$$Q_0^k = \sum_{n=1}^{N} S_n^k a_n^{(c)} \quad (11d)$$

$$I_1^k = \Delta\omega^k \sum_{n=1}^{N} S_n^k b_n^{(c)} \quad (11e)$$

$$Q_1^k = \Delta\omega^k \sum_{n=1}^{N} S_n^k b_n^{(s)} \quad (11f)$$

$$A^k = I_0^k + I_1^k \quad (11g)$$

$$B^k = Q_0^k - Q_1^k \quad (11h)$$

It should e appreciated that the values of sine and cosine components $a_n^{(s)}$, $a_n^{(c)}$, $b_n^{(s)}$ and $b_n^{(c)}$ calculated in the step 11 are further utilized when the quantities $I_0^k$, $Q_0^k$, $I_1^k$, $Q_1^k$ are calculated for various frames, k=1, 2, . . .

In a step 13, the branches I and Q are generated consequently frame by frame according to the following equations:

$$I^k = A^k \xi^k + B^k \sigma^k \quad (12a)$$

$$Q^k = -A^k \sigma^k + B^k \xi^k \quad (12b)$$

As noted above, mostly "multiply and accumulate" operations are performed in calculation of sine I and cosine Q branches for each frame (except the calculations in accordance with Eq. (11a) and Eq. (11b)), thereby significantly reducing the computational load and memory requirements. Notwithstanding the fact that the sine functions are calculated by using Eq. (11a) and Eq. (11b) they do not impose significant computation overhead as they are performed only once per frame for each frame.

Accordingly, the iteration procedure utilized for updating the inner parameters and $\phi^k$ and $\Delta\omega^k$ (for obtaining the $I^{k+1}$-th and $Q^{k+1}$-th iteration of the branches) is described by Eqs. (13) and (14):

$$\phi^{k+1} = \phi^k + \omega^k N \Delta t \quad (13)$$

$$\omega^{k+1} = \omega_0 + \Delta\omega^{k+1}, \quad (14)$$

wherein, for example, the following initial conditions may be selected: k=1 (i.e. first frame); $\omega^1=0$; $\Delta\omega^1=0$; $\omega^1=\omega_0$; and $\omega_0$, N, $\Delta t$ are given values.

According to one non-limiting example, a frequency correction in the PLL $\Delta\omega^{k+1}$ may be calculated by utilizing a known per se "tanloc" technique in accordance with Eqs. (15)–(17):

$$PD_{err}{}^k = \arctan(Q^k/I^k) \tag{15}$$

$$PD_{Int}{}^k = PD_{Int}{}^{k-1} + PD_{err}{}^k \tag{16}$$

$$\Delta\omega^{k+1} = K_1 PD_{Int}{}^k + K_2 PD_{err}{}^k, \tag{17}$$

wherein $PD_{err}{}^k$ states for the phase detector error; $PD_{Int}{}^k$ states for the phase detector integral; $K_1$ and $K_2$ are constants.

According to another preferred embodiment of the present invention, before proceeding with calculation of the I and Q branches, Eq. (6) may be further modified to the following equivalent representation, to wit:

$$Z^k = e^{i(p\omega^k \Delta t + \varphi^k)} \sum_{n=1}^{N} S_n^k [f_n e^{i\omega_0(n-p)\Delta t}] e^{i(\Delta\omega^k(n-p)\Delta t)}, \tag{18}$$

wherein p is an arbitrary number. In the preferred embodiment, p is set as the "middle-point" of the frame, i.e. p=(N+1)/2.

Similar to as it was described above with respect to Eq. (7), Eq. (18) may also be simplified by applying the Taylor expansion to the exponential terms by using a value of $\Delta\omega^k(n-p)\Delta t$ as a small parameter, to wit:

$$Z^k \approx e^{i\psi^k} \sum_{n=1}^{N} S_n^k \alpha_n [1 + i\Delta\omega^k(n-p)\Delta t] = e^{i\psi^k} \sum_{n=1}^{N} S_n^k [\alpha_n + i\Delta\omega^k \beta_n], \tag{19}$$

wherein by definition:

$$\Psi^k = p\omega^k \Delta t + \phi^k,$$

$$\alpha_n = f_n e^{i\omega_0(n-p)\Delta t},$$

$$\beta_n = \alpha_n(n-p)\Delta t.$$

It might be readily appreciated that since the Taylor expansion in Eq. (18) was performed over the middle point of the frame then the utilizing of Eq. (19) has the following significant advantages, when compared with the utilization of Eq. (7):

(i) In contrast to condition (9), the Taylor expansion is now valid when $$\Delta\omega^k \left[\frac{N+1}{2}\right] \Delta t \ll 1, \tag{20}$$

which is about half of the former case. This enhances the accuracy of the computed branches.

(ii) Typically, tap values of the low-pass filter near the middle of the frame are large, and decay toward both ends. The Taylor-expansion error, on the other hand, is smallest near the center of the frame (being the expansion point) and grows towards the ends. Since the overall error of calculation is a product of these both factors, there is a substantial reduction of the error with respect to (7) and improvement of the accuracy when the values of the I and Q branches are calculated.

(iii) Typically, $f_n$ is symmetric, namely, $f_n = f_{N-n+1}$. As a consequence, the pre-computed arrays, which are needed in order to compute the branches, are either symmetric or anti-symmetric with respect to p. Hence, one needs to store in the current embodiment only half of the data needed for the embodiment based on Eq. (7).

Figure 2:
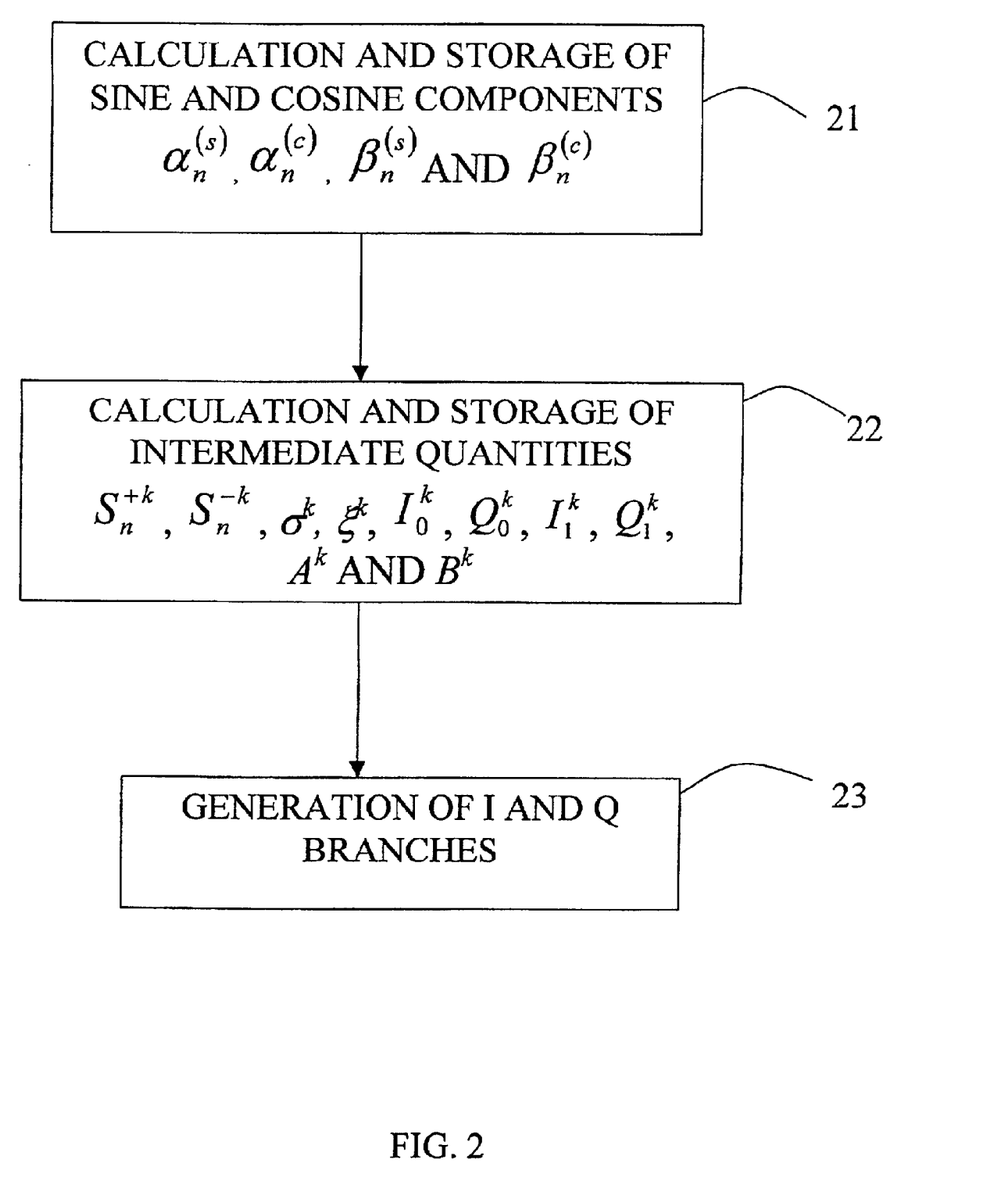
FIG. 2 is a flowchart illustrating another example of generation of sine and cosine branches of a digital sampled signal according to another preferred embodiment of the present invention.

Turning now to FIG. 2, there is provided another example of generation of the I and Q branches of the digital sampled signal $S_n^k$ divided into equal frames of N samples in each frame by utilizing the presentation of the I and Q branches by Eq. (19).

In this example, once the signal $S_n^k$ is fed into a PLL module utilizing the described technique, in a step 21, for any frame, analytical functions, such as arrays of sine and cosine components $\alpha_n^{(s)}$, $\alpha_n^{(c)}$, $\beta_n^{(s)}$ and $\beta_n^{(c)}$ are calculated according to Eqs. (21a)–(21d) and stored, to wit:

$$\alpha_n^{(s)} = f_n \sin[\omega_0(n-p)\Delta t] \tag{21a}$$

$$\alpha_n^{(c)} = f_n \cos[\omega_0(n-p)\Delta t] \tag{21b}$$

$$\beta_n^{(s)} = (n-p)\Delta t \alpha_n^{(s)} \tag{21c}$$

$$\beta_n^{(c)} = (n-p)\Delta t \alpha_n^{(c)} \tag{21d}$$

wherein n=1, ..., N/2 and p=(N+1)/2.

By utilizing the periodicity property of sine and cosine functions, the memory volume for storing the values of the components $\alpha_n^{(s)}$, $\alpha_n^{(c)}$, $\beta_n^{(s)}$ and $\beta_n^{(c)}$ may be further reduced by the manner described above in connection with the sine and cosine components $a_n^{(s)}$, $a_n^{(c)}$, $b_n^{(s)}$ and $b_n^{(c)}$.

Then a step 22 the intermediate quantities $S_n^{+k}$, $S_n^{-k}$, $\sigma^k$, $\xi^k$, $I_0^k$, $Q_0^k$, $I_1^k$, $Q_1^k$, $A^k$ and $B^k$ are calculated according to Eqs. (22a)–(22j) and stored for each k-th frame, to wit:

$$S_n^{+k} = S_n^k + S_{N+1-n}^k \tag{22a}$$

$$S_n^{-k} = S_n^k - S_{N+1-n}^k \tag{22b}$$

$$\sigma^k = \sin(p\omega^k \Delta t + \varphi^k) \tag{22c}$$

$$\xi^k = \cos(p\omega^k \Delta t + \varphi^k) \tag{22d}$$

$$I_0^k = \sum_{n=1}^{N/2} S_n^{-k} \alpha_n^{(s)} \tag{22e}$$

$$Q_0^k = \sum_{n=1}^{N/2} S_n^{+k} \alpha_n^{(c)} \tag{22f}$$

$$I_1^k = \Delta\omega^k \sum_{n=1}^{N/2} S_n^{-k} \beta_n^{(c)} \tag{22g}$$

$$Q_1^k = \Delta\omega^k \sum_{n=1}^{N/2} S_n^{+k} \beta_n^{(s)} \tag{22h}$$

$$A^k = I_0^k + I_1^k, \tag{22i}$$

$$B^k = Q_0^k - Q_1^k. \tag{22j}$$

Further, in a step 23, the branches I and Q having the index k are generated by employing the stored values for $\sigma^k$, $\xi^k$, $A^k$ and $B^k$ calculated by using Eqs. (22c), (22d), (22i), (22j) for substituting in Eqs. (12a) and (12b).

According to the preferred embodiment of the present invention, the iteration procedure for updating the inner parameters $\phi^k$ and $\Delta\omega^k$, and the frequency correction in the PLL is carried out in accordance with Eqs. (13) through (17).

Figure 3:
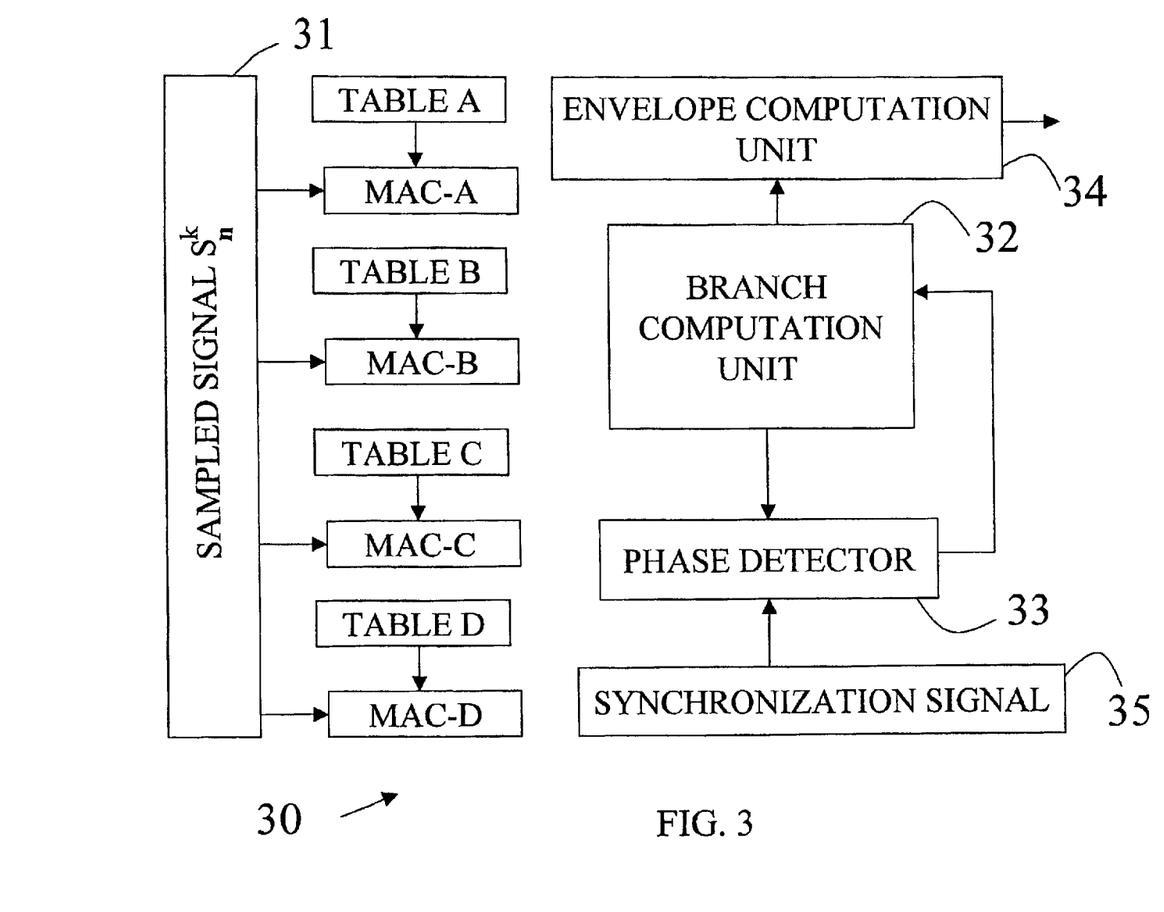
FIG. 3 is a block diagram illustration of operation of a phase locked loop unit according to preferred embodiment of the present invention.

Referring now to FIG. 3, a simplified block diagram of a PLL module 30 is shown according to one example of the present invention.

It should be appreciated that the PLL module may be employed for numerous applications, and a non-limiting one being an envelope demodulation described, for example, in U.S. application Ser. No. 09/575,517 (herein incorporated by reference).

The PLL module 30 receives ready-to-process frames of a digital sampled signal $S_n^k$ (31 in FIG. 3) divided into N frames.

According to one preferred embodiment of the present invention, the signal 31 is fed into multiply-and-accumulate units MAC-A, MAC-B, MAC-C and MAC-D.

According to another preferred embodiment of the present invention, the signal 31 is first subjected to symmetrization by a symmetrization module (not shown) around the midpoint, as described in Eqs. (22a) and (22b), and only after the symmetrization, the signal is fed into multiply-and-accumulate units MAC-A, MAC-B, MAC-C and MAC-D.

As shown in FIG. 3, the MAC-A to MAC-D units are provided also with data of the sine and cosine components. Preferably, these data are calculated off line by a computation unit (not shown) for any frame (preferably the first) of the signal 31 and stored in Table A, Table B, Table C, and Table D memory units.

According to one preferred embodiment, these sine and cosine components are the components of tables $a_n^{(s)}$, $a_n^{(c)}$, $b_n^{(s)}$ and $b_n^{(c)}$ calculated by utilizing Eqs. (10a) to (10d) (step 11 in FIG. 1).

According to another preferred embodiment of the invention these data are the components $\alpha_n^{(s)}$, $\alpha_n^{(c)}$, $\beta_n^{(s)}$ and $\beta_n^{(c)}$ calculated by utilizing Eqs. (10a) to (10d) (step 21 in FIG. 2).

According to one preferred embodiment of the invention, the components $a_n^{(s)}$, $a_n^{(c)}$, $b_n^{(s)}$ and $b_n^{(c)}$ are stored in the Table A, Table B, Table C and Table D units.

According to another preferred embodiment of the invention, the components $\alpha_n^{(s)}$, $\alpha_n^{(c)}$, $\beta_n^{(s)}$ and $\beta_n^{(c)}$ are stored in the Table A, Table B, Table C and Table D units.

According to one preferred embodiment of the invention, MAC-A to MAC-D units operate according to Eqs. (11c) through (11f).

According to another preferred embodiment of the invention, MAC-A to MAC-D units operate according to Eqs. (22e) through (22h).

The output of the MAC-A through MAC-D units are data indicative of the values of intermediate quantities $I_0^k$, $Q_0^k$, $I_1^k/\Delta\omega^k$ and $Q_1^k/\Delta\omega^k$. These data are fed into a Branch Computation Unit 32 that calculates the necessary intermediate quantities and generates the branches I and Q consequently frame by frame according to Eqs. (12a) and (12b).

According to this example, the PLL module 30 includes a Phase Detector 33 employed for generating an error signal that is used for locking the loop. The locking process is known per se, therefore, it will not be expounded hereinbelow. For example, the PLL module 30 may include the phase detector module described in the aforementioned U.S. application Ser. No. 09/575,517 and operate according to Eqs. (13) through (17).

In the case where the application of the invention is envelope computation, the output of the Branch Computation Unit 32 is further fed to an envelope computation unit 34 for envelope demodulation. For example, the PLL module 30 may include the envelope computation unit described in the aforementioned U.S. application Ser. No. 09/575,517.

According to a further aspect of the invention, a special technique described in U.S. application Ser. No. 09/575,517 and designed for providing a PLL module with an estimate of the envelope sign may be implemented. Thus, the Phase Detector 33 may be provided with a synchronization signal 35, delivering the phase information of the carrier, in order to determine the sign of the envelope.

As such, those skilled in the art to which the present invention pertains, can appreciate that while the present invention has been described in terms of preferred embodiments, the conception, upon which this disclosure is based, may readily be utilized as a basis for the designing of other structures systems and processes for carrying out the several purposes of the present invention.

It is apparent that in a multi-transmitter (multi-frequency) environment an array of the PLL modules operating on the same data frames may be implemented for each carrier whose envelope is sought. In such a case, the Discrete Fourier Transform (DFT) technique and the Fast Fourier Transform (FFT) technique, known per se, may be employed for fiber enhancing the calculation rate.

It is readily appreciated that similarly to the transition between Eq. (7) and Eq. (19), further recursive decompositions of the summation can be performed. The efficiency of these further decompositions depends on the input parameters and on the computational resources of computing platform (e.g., a DSP).

It should be noted that modern DSPs strongly support MACs, which is a strong motivation for the present invention. Also, the handful of tricks and enhancements presented in the description above, together with the implementation of suitable CPU architecture, make the PLL technique very effective computationally.

Moreover, symmetries of the sine and cosine functions, known to those skilled in the art, can be readily exploited to enhance the computations further. The implementation of these symmetries depend on the input parameters and on the computational resources.

It is readily appreciated that the abovementioned enhancements of the computation of the I and Q branches can be used separately or in any combination whatsoever, if the input parameters and computing resources are suitable. The efficiency of the resulting computation will depend, in general, on the input parameters and on the computational resources of the computing platform.

Moreover, any reference to a specific implementation in terms of usage of PLL resources, specific implementation of error signal generation, envelope computation, or any other components are shown by way of a non-limiting example.

It should also be understood that the digital PLL module according to the invention my be a suitably programmed computer system. Likewise, the invention contemplates a computer program being readable by a computer for executing the method of the invention. The invention further contemplates a machine-readable memory tangibly embodying a program of instructions executable by the machine for executing the method of the invention.

Also, it is to be understood that the phraseology and terminology employed herein are for the purpose of description and should not be regarded as limiting. It is important, therefore, that the scope of the invention is not construed as being limited by the illustrative embodiments set forth herein. Other variations are possible within the scope of the present invention as defined in the appended claims and their equivalents.

What is claimed is:

1. A method of operating a digital phase locked loop utilized for amplitude demodulation of a modulated signal, the method comprising:

(a) receiving an input digital sampled signal representing said modulated signal and divided into a plurality of frames having substantially equal number of samples, wherein a frequency of said input digital signal for each frame $\omega^k$ of said plurality of frames having a frame number k is represented as a sum of a nominal frequency component $\omega_0$, which is a common value to said plurality of frames, and a frequency component $\Delta\omega^k$, which is an increment depending on the frame number k and having an absolute value substantially smaller than a reversed value of a frame size N multiplied by a sampling time increment $\Delta t$;

(b) calculating data indicative of values of analytical functions including trigonometric functions depending at least on said nominal frequency component $\omega_0$ for each frame from said plurality of frames;

(c) storing the data obtained in step (b);

(d) generating an output signal representing sine I and cosine Q branches of said digital phase locked loop by utilizing the data of the analytical functions stored in step (c), values of the component $\Delta\omega^k$ and the increment $\Delta t$ for substantially all frames of said plurality of frames; and (e) computing an envelope of said modulated signal and generating a demodulated signal.

2. The method of claim 1 wherein step (b) and step (c) are performed off line.

3. The method of claim 1 wherein step (d) is performed on line.

4. The method of claim 1 wherein said analytical functions are arrays of sine and cosine components $a_n^{(s)}$, $a_n^{(c)}$, $b_n^{(s)}$ and $b_n^{(c)}$ calculated according the following equations:

$$a_n^{(s)} = f_n \sin(\omega_0 n \Delta t);$$
$$a_n^{(c)} = f_n \cos(\omega_0 n \Delta t);$$
$$b_n^{(s)} = n \Delta t \cdot a_n^{(s)};$$
$$b_n^{(c)} = n \Delta t \cdot a_n^{(c)};$$

wherein $f_n$ are taps of a low-pass filter; $\omega_0$ is said nominal frequency component; $\Delta t$ is a sampling time increment; n=1, 2, ..., N; and N is the number of the samples in the frame.

5. The method of claim 1 wherein said analytical functions are arrays of sine and cosine components $\alpha_n^{(s)}$, $\alpha_n^{(c)}$, $\beta_n^{(s)}$ and $\beta_n^{(c)}$ calculated according the following equations:

$$\alpha_n^{(s)} = f_n \sin[\omega_0(n-p)\Delta t];$$
$$\alpha_n^{(c)} = f_n \cos[\omega_0(n-p)\Delta t];$$
$$\beta_n^{(s)} = (n-p)\Delta t \alpha_n^{(s)};$$
$$\beta_n^{(c)} = (n-p)\Delta t \alpha_n^{(c)};$$

wherein $f_n$ are taps of a low-pass filter; $\omega_0$ is said nominal frequency component; $\Delta t$ is a time increment; n=1, 2, ..., N/2; p=(N+1)/2; and N is the number of the samples in the frame.

6. The method of claim 1 wherein step (b) of calculating the data indicative of values of the analytical functions is performed by utilizing a property of periodicity of the trigonometric functions.

7. The method of claim 1 wherein the step of generating said output signal representing said sine and cosine branches comprising the steps of:

(a) calculating consequently frame by frame for each k-th frame the intermediate quantities $\sigma^k$, $\xi^k$, $I_0^k$, $Q_0^k$, $I_1^k$, $Q_1^k$, $A^k$, $B^k$; and (b) calculating the sine $I^k$ and cosine $Q^k$ branches; wherein k=1, 2 ...; and the calculations are performed according to the following equations:

$$\sigma^k = \sin(\varphi^k);$$
$$\xi^k = \cos(\varphi^k);$$
$$I_0^k = \sum_{n=1}^{N} S_n^k a_n^{(s)};$$
$$Q_0^k = \sum_{n=1}^{N} S_n^k a_n^{(c)};$$
$$I_1^k = \Delta\omega^k \sum_{n=1}^{N} S_n^k b_n^{(c)};$$
$$Q_1^k = \Delta\omega^k \sum_{n=1}^{N} S_n^k b_n^{(s)};$$
$$A^k = I_0^k + I_1^k;$$
$$B^k = Q_0^k - Q_1^k;$$
and
$$I^k = A^k \xi^k + B^k \sigma^k;$$
$$Q^k = -A^k \sigma^k + B^k \xi^k,$$

wherein $\varphi^k$ is the current phase estimate of the signal; and $\Delta\omega^k$ is said frequency component depending on the frame number.

8. The method of claim 1 wherein the step of generating said sine and cosine branches comprising the steps of:

(a) calculating frame by frame for each k-th frame the intermediate quantities $S_n^{+k}$, $S_n^{-k}$, $\sigma^k$, $\xi^k$, $I_0^k$, $Q_0^k$, $I_1^k$, $Q_1^k$, $A^k$, $B^k$; and (b) calculating the sine $I^k$ and cosine $Q^k$ branches; wherein k=1, 2 ...; and the calculations are performed according to the following equations:

$$S_n^{+k} = S_n^k + S_{N+1-n}^k;$$
$$S_n^{-k} = S_n^k - S_{N+1-n}^k;$$
$$\sigma^k = \sin(p\omega^k \Delta t + \varphi^k);$$
$$\xi^k = \cos(p\omega^k \Delta t + \varphi^k);$$
$$I_0^k = \sum_{n=1}^{N/2} S_u^{-k} \alpha_n^{(s)};$$
$$Q_0^k = \sum_{n=1}^{N/2} S_n^{+k} \alpha_n^{(c)};$$
$$I_1^k = \Delta\omega^k \sum_{n=1}^{N/2} S_n^{-k} \beta_n^{(c)};$$
$$Q_1^k = \Delta\omega^k \sum_{n=1}^{N/2} S_n^{+k} \beta_n^{(s)};$$
$$A^k = I_0^k + I_1^k;$$
$$B^k = Q_0^k - Q_1^k;$$
and
$$I^k = A^k \xi^k + B^k \sigma^k;$$
$$Q^k = -A^k \sigma^k + B^k \xi^k,$$

wherein $\varphi^k$ is the current phase estimate of the signal; $\Delta\omega^k$ is said frequency component depending on the frame number; and $\Delta t$ is the sampling time increment.

9. A method of operating a digital phase locked loop utilized for amplitude demodulation of a modulated signal, the method comprising:
(a) receiving an input digital sampled signal representing said modulated signal and divided into a plurality of frames having substantially equal number of samples;
(b) calculating and storing data independent of said frames indicative of values of trigonometric components of sine I and cosine Q branches;
(c) generating an output signal representing said sine and cosine branches using at least (i) mostly multiply-and-accumulate operation for substantially all of said frames, and (ii) said stored trigonometric component; and
(d) computing an envelope of said modulated signal and generating a demodulated signal.

10. A digital phase locked loop (PLL) module utilized for amplitude demodulation of a modulated signal and configured for receiving a digital sampled signal divided into a plurality of frames having substantially equal number of samples, wherein a frequency of said input digital signal for each frame $\omega^k$ of said plurality of frames having a frame number k is represented as a sum of a nominal frequency component $\omega_0$, which is a common value to said plurality of frames, and a frequency component $\Delta\omega^k$, which is an increment depending on the frame number k and having an absolute value substantially smaller than a reversed value of a frame size N multiplied by a sampling time increment $\Delta t$, the PLL module comprising:
at least one Table Memory Unit configured for storing data indicative of values of analytical functions including trigonometric functions depending at least on said nominal frequency;
at least one multiply-and-accumulate unit provided with the data stored in said at least one Table Memory Unit and configured to sum the results of multiplication of said digital sampled signal and said values of analytical functions frame by frame;
at least one Branch Computation Unit receiving output provided by said at least one multiply-and-accumulate unit and generating an output signal representing sine I and cosine Q branches of said digital phase locked loop by utilizing the data of said analytical functions stored in said Table Memory Unit;
at least one phase detector coupled and being responsive to the Branch Computation Unit and configured for generating an error signal for locking the PLL and providing said error signal to said at least one Branch Computation Unit; and
an envelope computation unit configured for receiving said output signal representing the sine I and cosine Q branches from said at least one Branch Computation Unit and computing an envelope of said digital sampled signal.

11. The PLL module of claim 10, wherein said at least one phase detector is further synchronized by a synchronization signal delivering phase information of a carrier to the PLL for determination of a sign of the envelope.

12. The PLL module of claim 10, wherein said at least one Table Memory Unit is further coupled to a computing unit for calculating said data indicative of values of analytical functions including trigonometric functions depending at least on said nominal frequency.

13. The PLL module of claim 10, wherein said analytical functions stored in said at least one Table memory Unit are arrays of sine and cosine components $a_n^{(s)}$, $a_n^{(c)}$, $b_n^{(s)}$ and $b_n^{(c)}$ calculated according the following equations:

$$a_n^{(s)} = f_n \sin(\omega_0 n \Delta t);$$

$$a_n^{(c)} = f_n \cos(\omega_0 n \Delta t);$$

$$b_n^{(s)} = n\Delta t \cdot a_n^{(s)};$$

$$b_n^{(c)} = n\Delta t \cdot a_n^{(c)},$$

wherein $f_n$ are taps of a low-pass filter; $\omega_0$ is said nominal frequency component; $\Delta t$ is the sampling time increment; n=1, ..., N; and N is the number of the samples in the frame.

14. The PLL module of claim 10, wherein said analytical functions stored in said at least one Table memory Unit are arrays of sine and cosine components $\alpha_n^{(s)}$, $\alpha_n^{(c)}$, $\beta_n^{(s)}$ and $\beta_n^{(c)}$ calculated according the following equations:

$$\alpha_n^{(s)} = f_n \sin[\omega_0(n-p)\Delta t];$$

$$\alpha_n^{(c)} = f_n \cos[\omega_0(n-p)\Delta t];$$

$$\beta_n^{(s)} = (n-p)\Delta t \alpha_n^{(s)};$$

$$\beta_n^{(c)} = (n-p)\Delta t \alpha_n^{(c)},$$

wherein $f_n$ are taps of a low-pass filter; $\omega_0$ is said nominal frequency component; $\Delta t$ is the sampling time increment; n=1, 2, ..., N/2; p=(N+1)/2; and N is the number of the samples in the frame.

15. The PLL module of claim 10, wherein the summing of the results of multiplication of the sampled digital signal $S_n^k$ and said values of analytical functions by said at least one multiply-and-accumulate unit is performed frame by frame according to the following equation:

$$I_0^k = \sum_{n=1}^{N} S_n^k a_n^{(s)};$$

$$Q_0^k = \sum_{n=1}^{N} S_n^k a_n^{(c)};$$

$$I_1^k / \Delta\omega^k = \sum_{n=1}^{N} S_n^k b_n^{(c)};$$

$$Q_1^k / \Delta\omega^k = \sum_{n=1}^{N} S_n^k b_n^{(s)},$$

thereby obtaining the intermediate quantities $I_0^k$, $Q_0^k$, $I_1^k/\Delta\omega^k$, and $Q_1^k/\Delta\omega^k$.

16. The PLL module of claim 15 wherein said at least one Branch Computation Unit is configured to receive the intermediate quantities $I_0^k$, $Q_0^k$, $I_1^k/\Delta\omega^k$, $Q_1^k/\Delta\omega^k$ from said at least one multiply-and-accumulate units and generate the sine $I^k$ and cosine $Q^k$ branches according to the following equation:

$$I^k = A^k \xi^k + B^k \sigma^k;$$

$$Q^k = -A^k \sigma^k + B^k \xi^k,$$

wherein $$\sigma^k = \sin(\phi^k);$$

$$\xi^k = \cos(\phi^k)$$

and $$A^k = I_0^k + I_1^k;$$

$$B^k = Q_0^k - Q_1^k,$$

wherein $\phi^k$ is the current phase estimate of the signal.

17. The PLL module of claim 10, wherein the summing of the results of multiplication of the sampled digital signal $S_n^k$ and said values of analytical functions by said at least one multiply-and-accumulate unit is performed frame by frame according to the following equation:

$$I_0^k = \sum_{n=1}^{N/2} S_n^{-k} a_n^{(s)};$$

$$Q_0^k = \sum_{n=1}^{N/2} S_n^{+k} a_n^{(c)};$$

$$I_1^k / \Delta\omega^k = \sum_{n=1}^{N/2} S_n^{-k} \beta_n^{(c)};$$

$$Q_1^k / \Delta\omega^k = \sum_{n=1}^{N/2} S_n^{+k} \beta_n^{(s)},$$

wherein $$S_n^{+k} = S_n^k + S_{N+1-n}^k;$$

$$S_n^{-k} = S_n^k - S_{N+1-n}^k,$$

thereby obtaining the intermediate quantities $I_0^k$, $Q_0^k$, $I_1^k/\Delta\omega^k$, and $Q_1^k/\Delta\omega^k$.

18. The PLL module of claim 17 wherein said at least one Branch Computation Unit is configured to receive the intermediate quantities $I_0^k$, $Q_0^k$, $I_1^k/\Delta\omega^k$, $Q_1^k/\Delta\omega^k$ from said at least one multiply-and-accumulate unit and generate the sine $I^k$ and cosine $Q^k$ branches according to the following equation:

$$I^k = A^k \xi^k + B^k \sigma^k;$$

$$Q^k = -A^k \sigma^k + B^k \xi^k,$$

wherein $$\sigma^k = \sin(p\omega^k \Delta t + \phi^k);$$

$$\xi^k = \cos(p\omega^k \Delta t + \phi^k);$$

and $$A^k = I_0^k + I_1^k,$$

$$B^k = Q_0^k - Q_1^k,$$

wherein $\phi^k$ is the current phase estimate of the signal.

19. In a multi-transmitter environment an array of PLL modules operating on a frame of said plurality of frames in accordance with claim 10, wherein each PLL module of said array is implemented, respectively, for each transmitter of said multi-transmitter environment.

20. The PLL module of claim 10 for use in Cellular Phones and Wireless communication technology.

21. The PLL module of claim 10 for use in MRI and NMR medical systems.

22. The PLL module of claim 10 for use in RF communication components of digital receivers.

23. The PLL module of claim 10 for use in radar systems.

24. The module of claim 10 for use in sonar systems.

25. The PLL module of claim 10 for use in navigation technology and apparatuses.

26. The PLL module of claim 10 for use in car safety systems.

27. The PLL module of claim 10 for use in RF-based systems for antenna positioning.

28. The PLL module of claim 10 for use in industrial applications for motor control.

29. A program storage device readable by machine, tangibly embodying a program of instructions executable by the machine to perform method steps for operating a digital phase locked loop utilized for amplitude demodulation of a modulated signal, the method comprising:

(a) receiving an input digital sampled signal representing said modulated signal and divided into a plurality of frames having substantially equal number of samples; wherein a frequency of said input digital signal for each frame $\omega^k$ of said plurality of frames having a frame number k is represented as a sum of a nominal frequency component $\omega_0$, which is a common value to said plurality of frames, and a frequency component $\Delta\omega^k$, which is an increment depending on the frame number k and having an absolute value substantially smaller than a reversed value of a frame size N multiplied by a sampling time increment $\Delta t$;

(b) calculating data indicative of values of analytical functions including trigonometric functions depending at least on said nominal frequency component $\omega_0$ for each frame from said plurality of frames;

(c) storing the data of the analytical functions obtained in step (b);

(d) generating an output signal representing sine I and cosine Q branches of said digital phase locked loop by utilizing the data of the analytical functions stored in step (c), values of the component $\Delta\omega^k$, and the time increment $\Delta t$ for substantially all frames of said plurality of frames; and (e) computing an envelope of said modulated signal and generating a demodulated signal.

30. A computer program product comprising a computer useable medium having computer readable program code embodied therein for operating a digital phase locked loop utilized for amplitude demodulation of a modulated signal, the computer program product comprising:

computer readable program code for causing a computer to receive an input digital sampled signal representing said modulated signal and being divided into a plurality of frames having substantially equal number of samples; wherein a frequency of said input digital signal for each frame $\omega^k$ of said plurality of frames having a frame number k is represented as a sum of a nominal frequency component $\omega_0$, which is a common value to said plurality of frames, and a frequency component $\Delta\omega^k$, which is an increment depending on the frame number k and having an absolute valve substantially smaller than a reversed value of a frame size N multiplied by a sampling time increment $\Delta t$;

computer readable program code for causing the computer to calculate data indicative of values of analytical functions including trigonometric functions depending at least on said nominal frequency component $\omega_0$ for each frame from said plurality of frames;

computer readable program code for causing the computer to store the data indicative of values of analytical functions including trigonometric functions depending at least on said nominal frequency;

computer readable program code for causing the computer to generate an output signal representing sine I and cosine Q branches of said digital phase locked loop by utilizing the data of the analytical functions stored, values of the component $\Delta\omega^k$ and the time increment $\Delta t$ for substantially all frames of said plurality of the frames; and computer readable program code for causing the computer to compute an envelope of said modulated signal and to generate a demodulated signal.

* * * * *